(12) United States Patent  (10) Patent No.: US 7,466,139 B2
Furukawa  (45) Date of Patent: Dec. 16, 2008

(54) METHOD TO DETERMINE CURRENT DETECTION CIRCUIT FAILURE

(75) Inventor: Kimihiko Furukawa, Kakogawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 120 days.

(21) Appl. No.: 11/500,398

(22) Filed: Aug. 8, 2006

(65) Prior Publication Data

US 2007/0041140 A1  Feb. 22, 2007

(30) Foreign Application Priority Data

Aug. 17, 2005  (JP)  ............................... 2005-237013

(51) Int. Cl.
  *G01R 31/14* (2006.01)
  *G01R 31/28* (2006.01)
(52) U.S. Cl. .................. 324/511; 324/117 H; 324/500; 123/406.14
(58) Field of Classification Search .................. 324/511
  See application file for complete search history.

(56) References Cited

U.S. PATENT DOCUMENTS

| | | | |
|---|---|---|---|
| 4,639,665 A * | 1/1987 | Gary | 324/117 H |
| 2001/0009147 A1 * | 7/2001 | Takashima et al. | 123/406.14 |
| 2004/0189315 A1 * | 9/2004 | Muratov et al. | 324/500 |
| 2005/0073292 A1 * | 4/2005 | Hastings et al. | 324/117 H |
| 2005/0101193 A1 * | 5/2005 | Godard | 439/652 |
| 2005/0125124 A1 * | 6/2005 | Nagase et al. | 701/41 |
| 2005/0241875 A1 * | 11/2005 | Ta et al. | 180/443 |

FOREIGN PATENT DOCUMENTS

JP  9-23501  1/1997

* cited by examiner

*Primary Examiner*—Timothy J Dole
*Assistant Examiner*—Benjamin M Baldridge
(74) *Attorney, Agent, or Firm*—Wenderoth, Lind & Ponack, L.L.P.

(57) ABSTRACT

A method of determining current detection circuit failure determines failure of a current detection circuit that is connected to positive and negative sides of a power source and that issues a voltage corresponding to detected current at an output terminal. The method of determining failure cuts-off either one of the current detection circuit connections to the positive and negative sides of the power source, detects output voltage from the output terminal, and determines proper operation or failure of the current detection circuit.

20 Claims, 2 Drawing Sheets

METHOD TO DETERMINE CURRENT DETECTION CIRCUIT FAILURE

BACKGROUND OF THE INVENTION

1. Field of the Invention

This invention relates to a method of determining failure of a current detection circuit that detects battery charging and discharging current primarily in a vehicle such as a hybrid car.

2. Description of the Related Art

A hybrid car charges and discharges its batteries while maintaining remaining battery capacity within a prescribed range. This is because over-charging or over-discharging can markedly degrade battery performance. Remaining battery capacity is computed by integrating battery charging and discharging current. Therefore, stable and reliable detection of charging and discharging current is very important in a hybrid car. If it becomes impossible to detect current for integration to obtain battery capacity, estimates of battery capacity become incorrect and batteries can be negatively affected. Battery charging and discharging current is detected by a current detection circuit. Batteries can be charged and discharged normally by determining whether or not the current detection circuit is functioning properly.

Meanwhile, a circuit for determining current detection circuit failure has been developed (Japanese Patent Application Disclosure HEI 9-23501 [1997]).

The prior art circuit mentioned above is provided with a control circuit made up of an inverter circuit to supply current to a three-phase motor, three current sensors to detect current flow through the motor, a tachometer circuit to detect motor rotational speed, a current command generation circuit, a current control circuit, and a pulse width modulation (PWM) signal generation circuit to issue PWM signals. The control circuit executes control of motor operation. The prior art circuit is also provided with a means to determine sensor malfunction, which judges whether a value computed from detected current meets a specified value and issues an error signal depending on that outcome. Further, the prior art circuit is provided with a sensor diagnostic means, which supplies diagnostic current to the three-phase motor based on the error signal and determines if the current sensors are malfunctioning or operating properly depending on detected diagnostic current. Thus, the prior art disclosure describes a circuit configured to execute control of motor operation corresponding to both normal and abnormal sensor operation.

The apparatus described above determines if current sensors are functioning normally or abnormally while current is being supplied to the motor. For example, in a hybrid car, circuits for supplying diagnostic currents and detection of those currents are normally not installed. This is because the circuitry would become complex and cost would be increased. Incidentally, a method of detecting current detection circuit offset to eliminate that offset is well known. That method utilizes periods when current is clearly not flowing. For example, in a system that has an opening and closing switch mechanism, current does not flow when the switch mechanism is in the open state. Therefore, times when the switch mechanism is in the open state are often used to detect offset. However, a state of no current flow cannot serve the additional purpose of determining failure of a current detection circuit. Failure of the current detection circuit cannot be determined because the current detection circuit outputs 0 V as the detected voltage for no current. Specifically, the current detection circuit outputs the same no-voltage signal when it has failed, or when it is operating properly and current flow is 0 A. For example, a current detection circuit with a wire-harness connected to its output-side will have a 0 V output voltage when a failure, such as wire-harness contact failure or open circuit, occurs. It will also have the same 0 V output voltage when the detected current is 0 A. Consequently, failures, such as those in the wire-harness, cannot be determined in a state of no current flow.

SUMMARY OF THE INVENTION

The present invention was developed with the object of solving the problems described above. Thus it is a primary object of the present invention to provide a method of determining current detection circuit failure that can reliably determine whether or not a current detection circuit operates properly via a simple circuit structure.

The present invention determines current detection circuit failure by the following techniques. The method to determine current detection circuit failure of the present invention is a method that detects failure of a current detection circuit, which is connected to positive and negative sides of a power source and outputs a voltage corresponding to the detected current at an output terminal. This method of determining failure cuts-off either the positive power source connection or the negative power source connection to the current detection circuit, and determines proper operation or failure of the current detection circuit by the change in output voltage issued from the output terminal.

The above method of determining failure operates under the condition of 0 A of current detected by the current detection circuit. In the no-current state, either the positive or negative power source connection to the current detection circuit is cut-off, and proper operation or failure of the current detection circuit can be determined by the change in output voltage issued from the output terminal.

The method of determining current detection circuit failure of the present invention can cut-off connection of the positive-side of the power source to supply the current detection circuit from the negative-side only. In this condition, the current detection circuit can be judged as operating properly when output voltage is shifted negative from a reference voltage. The current detection circuit can be judged as failing when output terminal voltage becomes the reference voltage.

In addition, the method of distinguishing current detection circuit failure of the present invention can cut-off connection of the negative-side of the power source to supply the current detection circuit from the positive-side only. In this condition, the current detection circuit can be judged as operating properly when output voltage is shifted positive from a reference voltage. The current detection circuit can be judged as failing when output terminal voltage becomes the reference voltage.

Further, the method of distinguishing current detection circuit failure of the present invention can cut-off either the positive or negative power source connection to the current detection circuit. In this condition, the current detection circuit can be judged as operating properly or failing by the output voltage issued from the output terminal.

The above method of determining failure can cut-off connection of the positive-side of the power source to supply the current detection circuit from the negative-side only. In this condition, the current detection circuit can be judged as operating properly when output voltage is shifted negative from a reference voltage. The current detection circuit can be judged as failing when output terminal voltage becomes the reference voltage or is within a specified voltage range.

In addition, the above method of distinguishing failure can cut-off connection of the negative-side of the power source to supply the current detection circuit from the positive-side only. In this condition, the current detection circuit can be judged as operating properly when output voltage is shifted positive from a reference voltage. The current detection circuit can be judged as failing when output terminal voltage becomes the reference voltage or is within a specified voltage range.

Furthermore, the reference voltage for the above method of distinguishing failure can be 0 V.

The above method of determining current detection circuit failure can reliably determine if the current detection circuit is operating properly or has failed with a simple circuit structure. This is because the method of determining failure of the present invention cuts-off either the positive or negative power source connection to the current detection circuit, and determines proper operation or failure of the current detection circuit by the change in output voltage issued from the output terminal. It also cuts-off either the positive or negative power source connection to the current detection circuit, and determines proper operation or failure of the current detection circuit by the output voltage issued from the output terminal. In particular, the above method of determining failure cuts-off either the positive or negative power source connection to the current detection circuit, and determines proper operation or failure by the change in output voltage or by that output voltage value. Therefore, it has the characteristic that failures, such as wire-harness contact failure or open circuit, can also be reliably determined even, for example, when detected current is 0 A.

The above and further objects and features of the invention will more fully be apparent from the following detailed description with accompanying drawings.

DETAILED DESCRIPTION OF THE PREFERRED EMBODIMENTS

Figure 1:
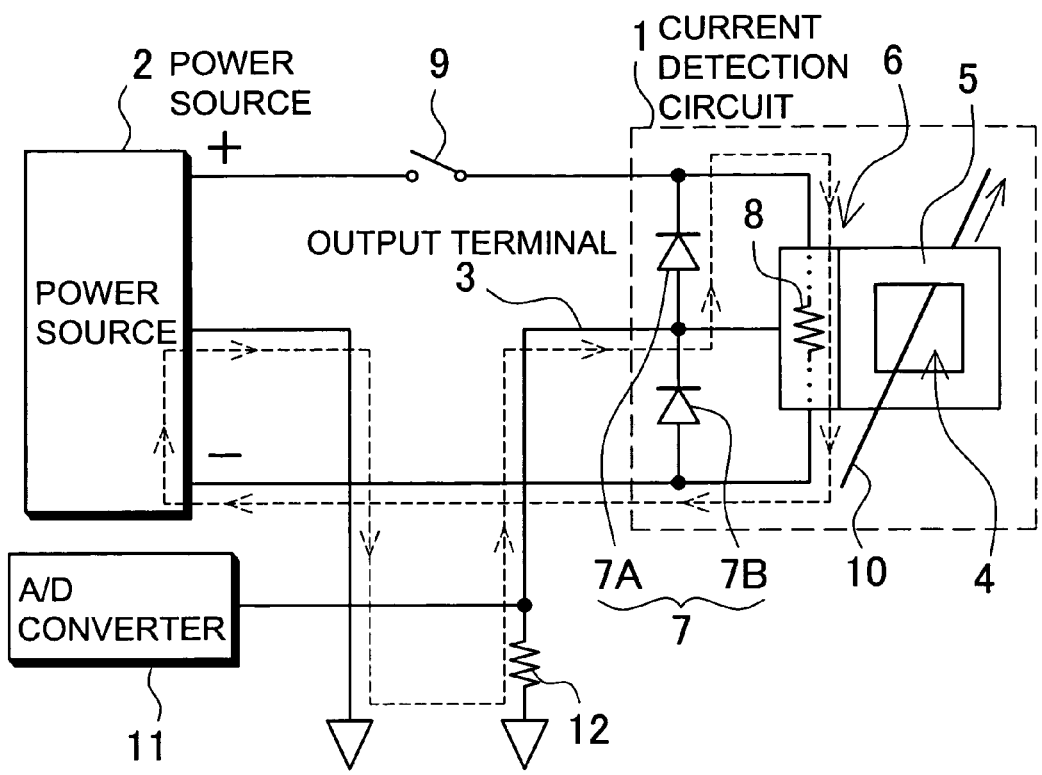
FIG. 1 is a circuit diagram showing a circuit used in a method of determining current detection circuit failure related to an embodiment of the present invention.
Figure 2:
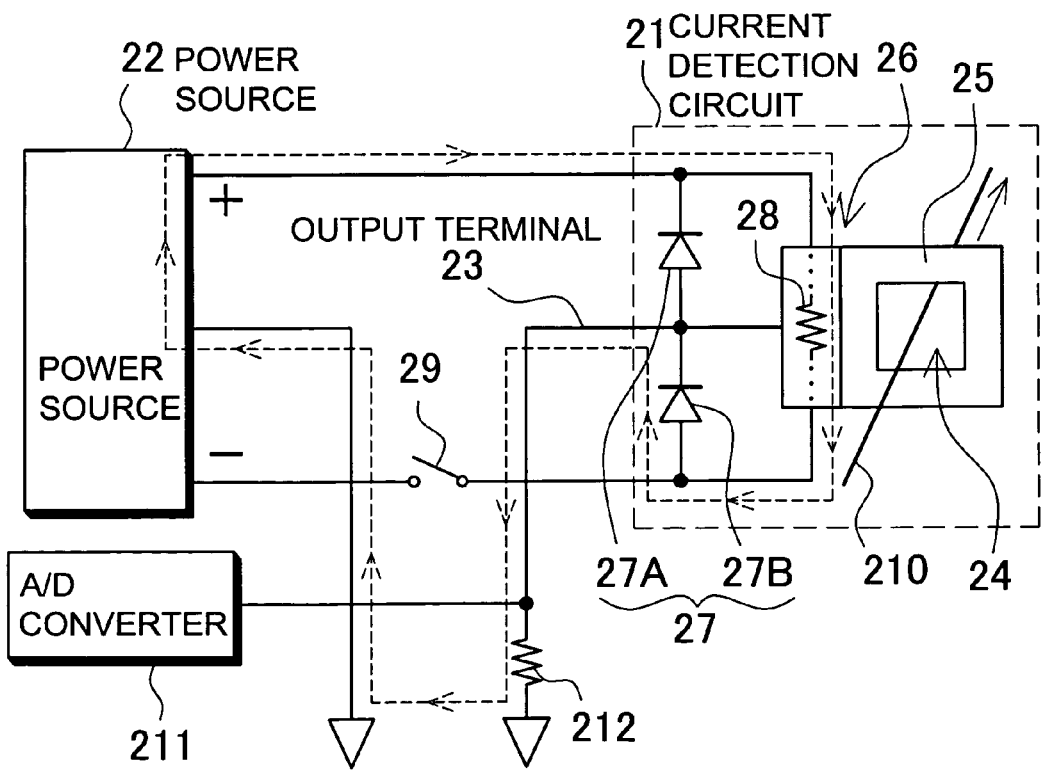
FIG. 2 is a circuit diagram showing a circuit used in a method of determining current detection circuit failure related to another embodiment of the present invention.

Turning to FIG. 1, an embodiment of the present invention is shown. The current detection circuit 1 has a switch 9, which cuts-off the positive-side of the power source 2, connected between the positive-side of the power source 2 and the current detection circuit 1. FIG. 2 shows another embodiment of the present invention. In FIG. 2, the current detection circuit 21 has a switch 29, which cuts-off the negative-side of the power source 22, connected between the negative-side of the power source 22 and the current detection circuit 21.

Each current detection circuit 1, 21 shown in FIGS. 1 and 2 is connected to the positive and negative sides of the power source 2, 22, and outputs a voltage corresponding to detected current at its output terminal 3, 23. The current detection circuit 1, 21 has a through-hole 4, 24, and a line for current detection 10, 210, in which current is measured, passes through the through-hole 4, 24. A Hall-effect type magnetic sensor 5, 25 is provided at the periphery of the through-hole 4, 24 to detect magnetic flux generated by current flowing in the line 10, 210. In addition, the current detection circuit 1, 21 houses a conversion circuit 6, 26 to convert the magnitude and direction of magnetic flux detected by the magnetic sensor 5, 25 to a voltage magnitude and polarity. The conversion circuit 6, 26 outputs a voltage from the output terminal 3, 23 that is proportional to the current flowing in the line for current detection 10, 210. Further, the conversion circuit 6, 26 switches output terminal 3, 23 voltage positive or negative depending on the direction of current flow through the line 10, 210. For example, when current flows in the direction shown by the arrow in the figures, output voltage is positive, and when current flows in a direction opposite the arrow in the figures, output voltage is negative.

The current detection circuit 1, 21 has a line for current detection 10, 210 inserted in a through-hole 4, 24, and detects current via magnetic flux. However, the method of determining current detection circuit failure of the present invention does not specify or limit current detection to always be via magnetic flux. Although not illustrated, a current sensing resistor, for example, may be connected in series with the line for current detection, and the current detection circuit can detect the voltage developed across the terminals of that current sensing resistor to detect current. This type of current detection circuit converts current to voltage, and also houses a conversion circuit to amplify and output that voltage. In this type of current detection circuit, output voltage is switched positive or negative depending on the direction of current flow.

As shown in FIGS. 1 and 2, the current detection circuit 1, 21 has diodes 7, 27 connected between the output terminal 3, 23 and the positive and negative power source 2, 22. Further, an equivalent circuit for sensor load 8, 28 is shown connected between positive and negative-sides of the power source 2, 22. The diodes 7, 27 are connected in reverse-bias configuration between the output terminal 3, 23 and the positive and negative power source 2, 22. Specifically, the diode 7A, 27A connected between the positive-side power source 2, 22 and the output terminal 3, 23 is connected to pass current from the output terminal 3, 23 to the positive-side power source 2, 22. Similarly, the diode 7B, 27B connected between the negative-side power source 2, 22 and the output terminal 3, 23 is connected to pass current from the negative-side power source 2, 22 to the output terminal 3, 23. These diodes 7, 27 act as protection diodes to prevent output terminal voltage from exceeding the power source voltages, as well as providing static discharge protection.

The sensor circuit load 8, 28 is an equivalent resistor that accounts for power consumption by the current detection circuit 1, 21. Current detection circuit power consumption is represented by an equivalent circuit that is a resistor connected between positive and negative-sides of the power source 2, 22. This resistor represents the sensor circuit load 8, 28 of the current detection circuit 1, 21.

A current detection circuit 1, 21 installed in a car has its output terminal 3, 23 connected to an analog-to-digital (A/D) converter 11, 211 via conductors such as a wire-harness. A current signal that is converted to a digital signal via the A/D converter 11, 211 is input to a control circuit (not illustrated). While the current detection circuit 1, 21 detects current, the control circuit controls supply current to the motor, and/or other equipment, and also controls battery charging current. As described below, prior to control of motor supply current, charging current, and discharging current, it is determined whether or not the current detection circuit 1, 21 is operating properly.

Proper operation or failure of the current detection circuit 1, 21 is determined by cutting-off either the positive or negative power source 2, 22 connection to the current detection circuit 1, 21 and determining the change in output voltage developed at the output terminal 3, 23. The current detection circuit 1, 21 shown in FIGS. 1 and 2 has a switch 9, 29 connected between the power source 2, 22 and the current detection circuit 1, 21 to cut-off connection to one side of the positive and negative power source 2, 22. The current detection circuit 1 of FIG. 1 has a switch 9 connected between the positive-side power source 2 and the current detection circuit 1 to cut-off the positive-side power source 2. The current detection circuit 21 of FIG. 2 has a switch 29 connected between the negative-side power source 22 and the current detection circuit 21 to cut-off the negative-side power source 22.

For the current detection circuit 1, 21 described above, failure is determined as described below. The embodiment below shows determination of proper operation or failure of the current detection circuit 1, 21 under the condition of 0 A of current flow through the line for current detection 10, 210. However, the present invention can also determine proper operation or failure of the current detection circuit when current flows through the line for current detection.

In the current detection circuit 1, 21, proper operation or failure is determined as follows in a state of 0 A current flow through the line for current detection 10, 210. The switch 9, 29 is temporarily switched OFF, and output terminal voltage is detected to determine if the current detection circuit 1, 21 has failed. This is because there is a difference in output voltage between proper operation and failure of the current detection circuit 1, 21 when the switch 9, 29 is in the OFF state.

When the switch 9, 29 is in the ON state and 0 A of current flows, output voltage is 0 V if the current detection circuit 1, 21 is operating properly. For example, if there is no signal output from the output terminal 3, 23 due to a failure such as contact failure of the wire-harness connected to the output-side of the current detection circuit 1, 21 or open circuit failure, the output voltage measured by the current detection circuit 1, 21 and transmitted via the A/D converter 11, 211 will be 0 V (the reference voltage). Consequently, since output voltage is 0 V for proper operation and for failure alike when current flow is 0 A, failure such as wire-harness contact failure cannot be determined.

However, when the switch 9, 29 is switched to the OFF state and the current detection circuit 1, 21 is functional and operating properly, current will flow as shown by the broken line of FIG. 1 and a negative voltage will be output at the output terminal 3 of the current detection circuit 1. Similarly, current will flow as shown by the broken line of FIG. 2 and a positive voltage will be output at the output terminal 23 of the current detection circuit 21. In contrast, if there is a failure such as contact failure or open circuit failure, output voltage will be 0 V.

Given this output voltage behavior, in the present embodiment, if operation is normal and the switch 9, 29 is switched from the ON state to the OFF state, output voltage will transition from 0 V to a negative voltage or to a positive voltage. If operation is abnormal, output voltage (0 V) will not change even though the switch 9, 29 is switched from the ON state to the OFF state. If the change in output voltage is within a specified value when the switch 9, 29 is switched from the ON state to the OFF state, the control circuit can judge that the current detection circuit 1, 21 has a failure such as a connection failure or open circuit failure. Otherwise, if the change in output voltage exceeds the specified value, the current detection circuit 1, 21 is judged to be operating properly.

Instead of this type of current detection circuit functionality judgment, the control circuit can judge that the current detection circuit 1, 21 is operating properly when the switch 9, 29 is switched to the OFF state and the control circuit detects a positive or negative output voltage exceeding a set value. If the magnitude of the output voltage is less than the set value, the current detection circuit 1, 21 can be judged to have a failure such as a connection failure or open circuit failure. These types of judgments of current detection circuit proper functionality or failure, as described above, are made in the control circuit (not illustrated), which inputs A/D converter 11, 211 output. A software program used by a microprocessor inside the control circuit is executed for detection and judgment associated with the current detection circuit 1, 21.

In a properly operating current detection circuit 1 with the switch 9 in the OFF state, as shown in FIG. 1, current flows in a loop (broken line) from the power source 2, through an output resistor 12 connected to the output terminal 3, through the diode 7A connected between the output terminal 3 and the positive-side power source 2, through the sensor circuit load 8, to the negative-side power source 2. Since this current flows through the output resistor 12 from the power source ground to the output terminal-side, a negative voltage is output from the output terminal 3.

Similarly, in a properly operating current detection circuit 21 with the switch 29 in the OFF state, as shown in FIG. 2, current flows in a loop (broken line) from the positive-side power source 22, through the sensor circuit load 28, through the diode 27B connected between the output terminal 23 and the negative-side power source 22, through the output resistor 212 connected to the output terminal 23, to the power source 22. Since this current flows through the output resistor 212 from the output terminal-side to the power source ground, a positive voltage is output from the output terminal 23.

As described above, output voltage becomes 0 V for failure of the current detection circuit 1, 21 of FIGS. 1 and 2. Here, another embodiment of the present invention is described using FIG. 3. In the embodiment shown in FIG. 3, elements, which are the same as those of the previous embodiment shown in FIG. 1, have the same identifying label except for the left-most digit, and their detailed description is abridged.

Figure 3:
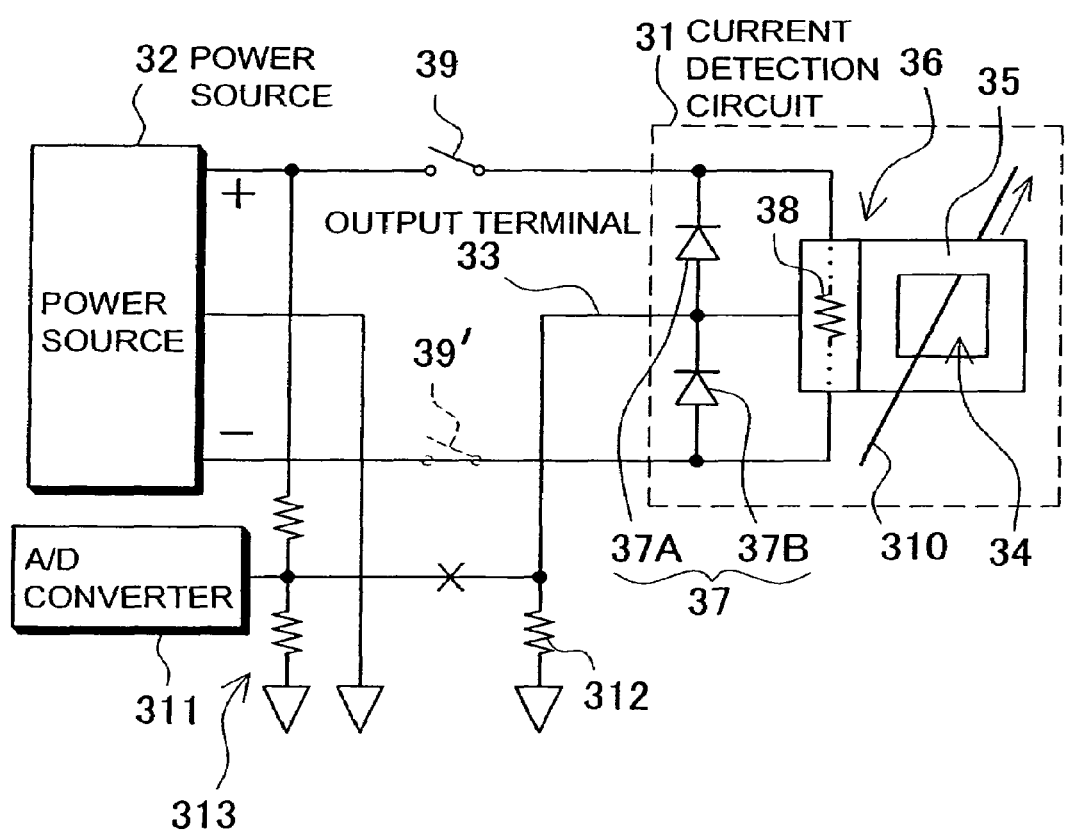
FIG. 3 is a circuit diagram showing a circuit used in a method of determining current detection circuit failure related to another embodiment of the present invention.

As shown in FIG. 3, a bias circuit 313 is connected to the current detection circuit 31 to supply a bias voltage at its output. When contact failure or open circuit failure occurs, current detection circuit 31 output becomes a specified reference voltage set by the bias circuit 313 with the switch 39 in either the ON or OFF state. For proper current detection circuit operation and the switch 39 in the ON state, output also becomes the reference voltage set by the bias circuit 313. For proper current detection circuit operation and the switch 39 in the OFF state, output becomes a voltage shifted positive or negative from the reference voltage. This is explained as follows. If connection failure or open circuit failure is represented by an open circuit at the x-mark in FIG. 3 between the bias circuit 313 and the output-side of the current detection circuit 31, voltage at the input of the A/D converter 311 becomes the reference voltage set by the bias circuit 313 with the switch 39 in either the ON or OFF state.

For proper current detection circuit operation and 0 A of current flow, output becomes the reference voltage set by the bias circuit 313. If the switch 39 is switched to the OFF state, the properly operating current detection circuit 31 will output a negative voltage (with no bias circuit). This current detection circuit output acts to shift the bias circuit voltage to output a voltage shifted from the reference voltage. If a switch 39' shown by the broken-line in FIG. 3 is provided instead of the switch 39, and switch 39' is switched to the OFF state, a properly operating current detection circuit 31 will output a positive voltage (with no bias circuit). This current detection circuit output acts to shift the bias circuit voltage to output a voltage shifted from the reference voltage.

Since a bias circuit is not provided for the current detection circuit 1, 21 shown in FIGS. 1 and 2, the reference voltage is 0 V, which is output when failure occurs with the switch 9, 29 in the OFF state. When the current detection circuit 1, 21 is operating properly and the switch 9, 29 is in the OFF state, a negative or positive voltage (shifted from the 0 V reference) is output from the output terminal 3, 23.

In the current detection circuit 1, 21, 31 described above, when the switch 9, 29, 39 is switched OFF, output terminal voltage can be detected to distinguish proper operation from failure. When the current detection circuit 1, 21, 31 detects current, the switch 9, 29, 39 is switched ON. In the current detection circuit 1 shown in FIG. 1, when current flow through the line for current detection 10 is cut-off and the switch 9 is ON, voltage at the output terminal 3 becomes the 0 V reference voltage for both proper operation and failure.

When the current detection circuit 1, 21, 31 described above is installed in a vehicle, such as a hybrid car, it is used as follows. Immediately after the car's ignition switch is turned ON, contactors (not illustrated) connected in series with the batteries are disengaged to the OFF state suspending the flow of battery current and the switch 9, 29, 39 is temporarily switched OFF. If the change in current detection circuit output voltage is within a specified value, current detection circuit failure, such as contact failure or open circuit failure, can be determined. If the change in current detection circuit output voltage exceeds the specified value, the current detection circuit is determined to be operating properly.

Further, when the switch 9, 29, 39 is in the OFF state, current detection circuit output terminal voltage can be compared with the reference voltage. If the output voltage is the reference voltage or within a set voltage (range), current detection circuit failure is judged. If the output voltage is shifted from the reference voltage or exceeds a set voltage (range), the current detection circuit 1, 21, 31 is judged to be operating properly. Subsequently, the switch 9, 29, 39 is turned ON to allow normal current detection by the current detection circuit 1, 21, 31.

At this time, before the contactors are turned ON, output terminal voltage should be acquired as current detection circuit offset. If the acquired voltage is larger than any normally expected offset, it is possible to determine a failure such as current detection circuit failure.

After confirming that the current detection circuit 1, 21, 31 is operating properly, contactors are switched ON to allow battery charging and discharging. Under these conditions, the car can be driven while monitoring battery current flow via the current detection circuit 1, 21, 31, and controlling current for charging and discharging the batteries.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within the metes and bounds of the claims or equivalence of such metes and bounds thereof are therefore intended to be embraced by the claims. This application is based on Application No. 2,005-237,013 filed in Japan on Aug. 17, 2005, the content of which is incorporated hereinto by reference.

What is claimed is:

1. A method of determining current detection circuit failure of a current detection circuit that is connected to a positive side and a negative side of a power source, the current detection circuit being operable to issue a voltage corresponding to a detected current at an output terminal, the method comprising:
   cutting off the positive-side of the power source so that the current detection circuit is supplied only by the negative-side of the power source; and
   comparing output voltage issued from the output terminal of the current detection circuit to a reference voltage, wherein the current detection circuit is determined to be operating properly if the output terminal voltage is more negative than the reference voltage, and current detection circuit failure is determined when the output terminal voltage is the reference voltage or within a specified voltage range.

2. The method of determining current detection circuit failure as recited in claim 1, wherein the current detection circuit detects current via a magnetic flux sensor that senses magnetic flux generated by the current to be detected.

3. The method of determining current detection circuit failure as recited in claim 1, wherein current is detected by the current detection circuit that outputs a voltage that is proportional to the detected current.

4. The method to determine current detection circuit failure as recited in claim 1, wherein current is detected by a current detection circuit that changes output voltage polarity depending on the direction of the detected current flow.

5. The method to determine current detection circuit failure as recited in claim 1, wherein current is detected by a current detection circuit with a circuit that connects reverse biased diodes between the output terminal and the positive and negative power source.

6. The method to determine current detection circuit failure as recited in claim 5, wherein current is detected by a current detection circuit with a circuit that connects a sensor circuit load between the positive-side and negative-side power source.

7. The method of determining current detection circuit failure as recited in claim 1, wherein current detection circuit failure is determined while supplying a bias voltage at an output-side of the current detection circuit.

8. The method of determining current detection circuit failure as recited in claim 1, wherein the current detection circuit is installed in a vehicle that is a hybrid car.

9. The method of determining current detection circuit failure as recited in claim 8, wherein immediately after the car ignition switch is turned ON, current detection circuit failure is determined in a condition with no battery current flow.

10. The method of determining current detection circuit failure as recited in claim 1, wherein current detection circuit offset is detected for a current detection circuit that is operating properly.

11. A method of determining current detection circuit failure of a current detection circuit that is connected to a positive side and a negative side of a power source, the current detection circuit being operable to issue a voltage corresponding to a detected current at an output terminal, the method comprising:
   cutting off the negative-side of the power source so that the current detection circuit is supplied only by the positive-side of the power source; and
   comparing the output voltage issued from the output terminal of the current detection circuit to a reference voltage, wherein the current detection circuit is determined to be operating properly if the output terminal voltage is more positive than the reference voltage, and current detection circuit failure is determined when the output terminal voltage is the reference voltage or within a specified voltage range.

12. The method of determining current detection circuit failure as recited in claim 11, wherein the current detection circuit detects current via a magnetic flux sensor that senses magnetic flux generated by the current to be detected.

13. The method of determining current detection circuit failure as recited in claim 11, wherein the current detection circuit outputs a voltage that is proportional to the detected current.

14. The method of determining current detection circuit failure as recited in claim 11, wherein the current detection circuit changes output voltage polarity depending on the direction of the detected current flow.

15. The method of determining current detection circuit failure as recited in claim 12, wherein the current detection circuit includes a circuit that connects reverse biased diodes between the output terminal and the positive side and negative side of the power source.

16. A method of determining current detection circuit failure of a current detection circuit that is connected to a positive side and a negative side of a power source, the current detection circuit being operable to issue a voltage corresponding to a detected current at an output terminal, the method comprising:

switching the current detection circuit from a connection to the positive side and the negative side of the power source to a state in which the positive-side power connection is cut-off, and supplying the current detection circuit only with current from the negative side of the power source; and detecting a change in the output voltage issued from the output terminal of the current detection circuit, wherein the current detection circuit is determined to be operating properly when the output voltage shifts negative.

17. The method of determining current detection circuit failure as recited in claim 16, wherein the current detection circuit outputs a voltage that is proportional to the detected current.

18. The method of determining current detection circuit failure as recited in claim 16, wherein the current detection circuit changes output voltage polarity depending on the direction of the detected current flow.

19. A method of determining current detection circuit failure of a current detection circuit that is connected to a positive side and a negative side of a power source, the current detection circuit being operable to issue a voltage corresponding to a detected current at an output terminal, the method comprising:

switching the connection of the current detection circuit from the positive and negative sides of the power source to a state in which the negative-side power source connection is cut-off, and supplying the current detection circuit with only current from the positive-side of the power source; and detecting a change in the output voltage issued from the output terminal of the current detection circuit, wherein the current detection circuit is determined to be operating properly when output voltage shifts positive.

20. The method of determining current detection circuit failure as recited in claim 19, wherein the current detection circuit outputs a voltage that is proportional to the detected current.

* * * * *